US007968255B2

(12) United States Patent
Kitahata et al.

(10) Patent No.: US 7,968,255 B2
(45) Date of Patent: Jun. 28, 2011

(54) PHOTOMASK

(75) Inventors: Yasuhisa Kitahata, Tokyo-to (JP);
Yasutaka Morikawa, Tokyo-to (JP);
Takashi Adachi, Tokyo-to (JP);
Nobuhito Toyama, Tokyo-to (JP);
Yuichi Inazuki, Tokyo-to (JP);
Takanori Sutou, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 66 days.

(21) Appl. No.: 12/373,762

(22) PCT Filed: Jul. 19, 2007

(86) PCT No.: PCT/JP2007/064249
§ 371 (c)(1),
(2), (4) Date: Jan. 14, 2009

(87) PCT Pub. No.: WO2008/010548
PCT Pub. Date: Jan. 24, 2008

(65) Prior Publication Data
US 2009/0311612 A1    Dec. 17, 2009

(30) Foreign Application Priority Data
Jul. 21, 2006 (JP) .................... 2006-199430

(51) Int. Cl.
*G03F 1/00*    (2006.01)
*G02B 5/08*    (2006.01)
(52) U.S. Cl. ........................... 430/5; 359/360
(58) Field of Classification Search ........ 430/5; 716/19;
355/53, 55; 359/360
See application file for complete search history.

(56) References Cited

U.S. PATENT DOCUMENTS

| 5,660,956 A | * | 8/1997 | Tomofuji et al. | 430/5 |
| 5,700,606 A | * | 12/1997 | Kobayashi et al. | 430/5 |
| 7,029,803 B2 | * | 4/2006 | Becker et al. | 430/5 |

FOREIGN PATENT DOCUMENTS

| JP | 06-075361 A | 3/1994 |
| JP | 2003-005349 A | 1/2003 |
| JP | 2003-084418 A | 3/2003 |
| JP | 2004-111678 A | 4/2004 |
| JP | 2005-093522 A | 4/2005 |
| JP | 2005-268489 A | 9/2005 |
| WO | 2005/076045 A1 | 8/2005 |

OTHER PUBLICATIONS

International Search Report: PCT/JP2007/064249.

* cited by examiner

*Primary Examiner* — Mark F Huff
*Assistant Examiner* — Stewart A Fraser
(74) *Attorney, Agent, or Firm* — Ladas & Parry LLP

(57) ABSTRACT

A photomask which improves the imaging performance that the photomask has and forming a good micro image on a wafer in photolithography with a half pitch of 60 nm or less. Provided is a photomask used for photolithography using an ArF excimer laser as an exposing source for immersion exposure by quadrupole-polarized illumination with a high-NA lens. The photomask includes a mask pattern of a light shielding film or semi-transparent film on a transparent substrate, and further, given that a thickness of the light shielding film or semi-transparent film is "t" nm, a refractive index is "n", an extinction factor is "k", and a bias of a space part of the mask pattern is "d" nm, when "t", "d", "n" and "k" are adjusted and the photomask is used for the photolithography, optical image contrast takes a value exceeding 0.580.

6 Claims, 8 Drawing Sheets d = 2 × a x = HALF PITCH × 4

FIG. 3A
FILM THICKNESS 20 nm
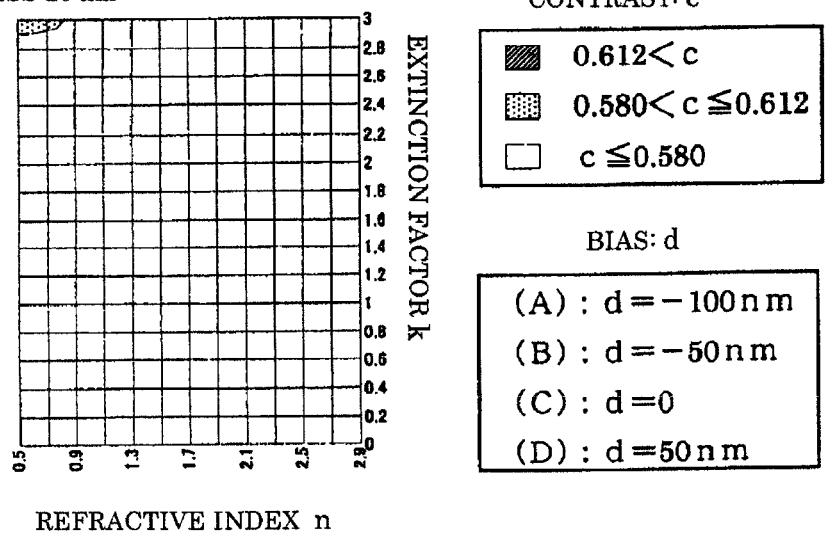
CONTRAST: c
| | |
|---|---|
| ▨ | $0.612 < c$ |
| ▦ | $0.580 < c \leq 0.612$ |
| □ | $c \leq 0.580$ |
BIAS: d
(A) : $d = -100\,nm$
(B) : $d = -50\,nm$
(C) : $d = 0$
(D) : $d = 50\,nm$
FILM THICKNESS 40 nm   FIG. 4A
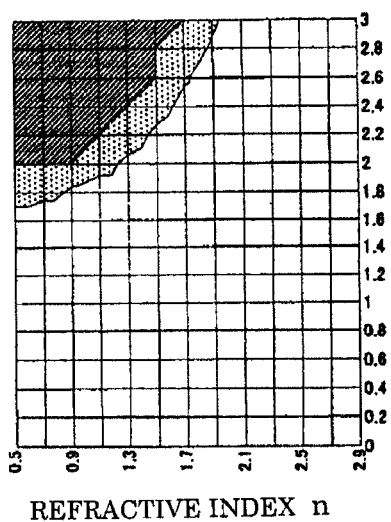
FIG. 4B
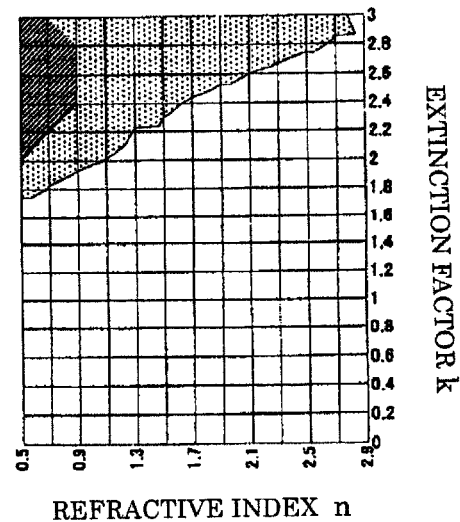

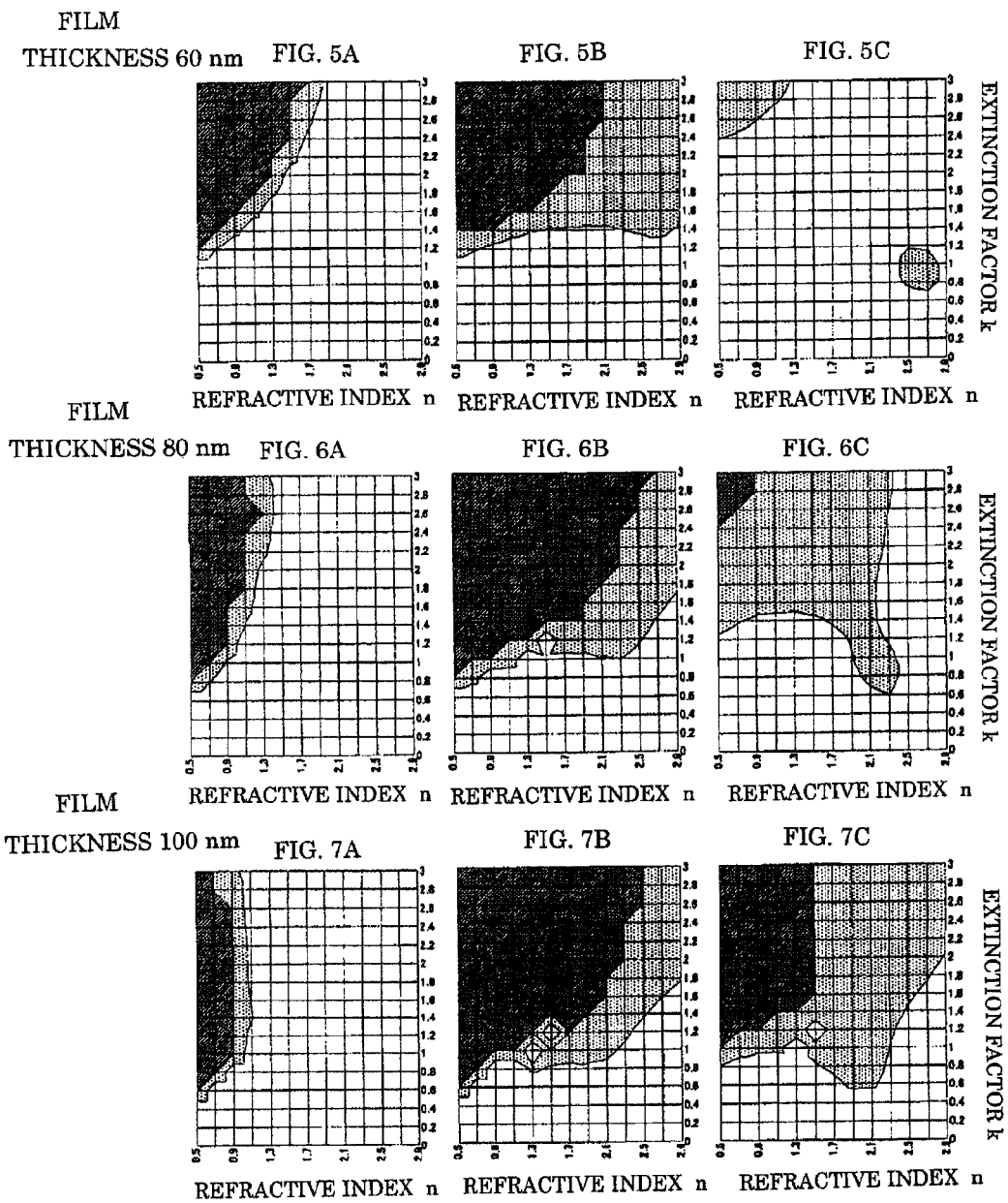

FILM THICKNESS 120 nm

FILM THICKNESS 140 nm

FILM THICKNESS 160 nm

EXTINCTION FACTOR k

EXTINCTION FACTOR k

REFRACTIVE INDEX n          REFRACTIVE INDEX n

FILM THICKNESS 180 nm
FIG. 11A
FIG. 11B
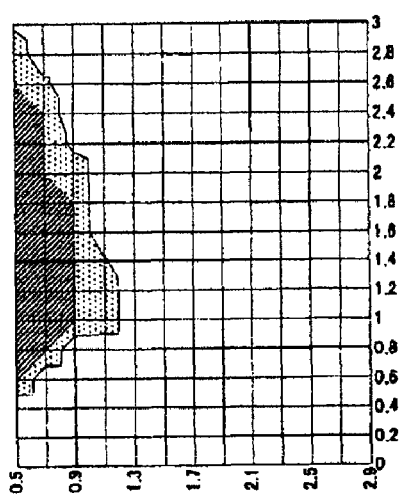
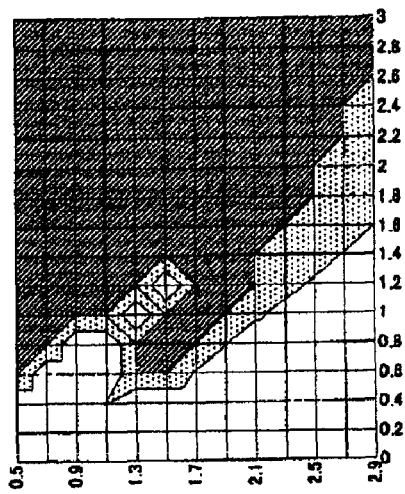
EXTINCTION FACTOR k
FIG. 11C
FIG. 11D
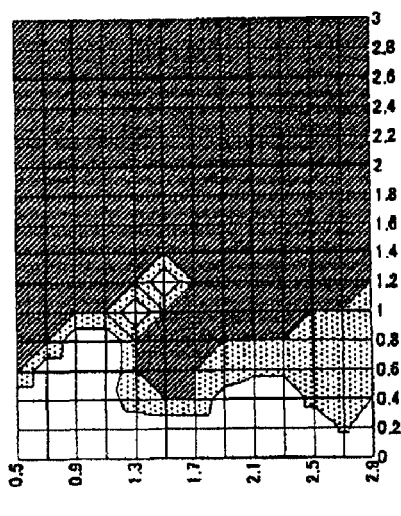
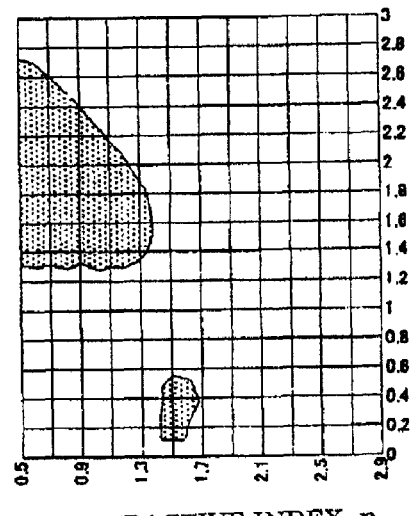
REFRACTIVE INDEX n
REFRACTIVE INDEX n
EXTINCTION FACTOR k FILM THICKNESS 200 nm REFRACTIVE INDEX n REFRACTIVE INDEX n

PHOTOMASK

TECHNICAL FIELD

The present invention relates to a photolithography technology used for pattern formation of semiconductor devices, and specifically to a photomask used for a leading-edge photolithography technology using high-NA exposure equipment for reducing and transferring a mask pattern nearly equal in size to the exposure wavelength on a wafer with a half pitch on the wafer (all half pitches are expressed in dimensions on the wafer in this description) of 60 nm or less.

BACKGROUND ART

To realize highly integrated ultrafine semiconductor devices developing in half pitch from 65 nm to 45 nm, in photolithography, as high-resolution technologies in exposure equipment, developments of various technologies such as a high-NA technology using a projector lens with high numeric aperture, an immersion exposure technology for exposure with a highly-refractive medium between a projector lens and a target of exposure, and an exposure technology with deformed illumination have been rapidly advanced.

On the other hand, as measures of improving resolution in a photomask (also referred to as a reticle) used for lithography, with miniaturization and higher precision of a conventional binary mask consisting of a part that passes light and a part that blocks light, developments and practical use of phase shifting masks such as a Levenson type (also referred to as Levenson-Shibuya type) phase shifting mask intended for improvement in resolution by phase shifting effect utilizing light interference, a halftone type phase shifting mask consisting of a part that transmits light and a part that semi-transmits light, a chromeless type phase shifting mask with no light shielding layer of chrome or the like are being advanced.

In the photolithography technology, since the minimum dimensions (resolution) that can be transferred by projection exposure equipment is proportional to the wavelength of light used for exposure but inversely proportional to the numeric aperture (NA) of a lens of a projection optical system, the wavelength of the exposure light is being shorter and the NA of the projection optical system is made higher upon request for miniaturization of semiconductors. However, the shorter wavelength and the higher NA have limitations for fulfilling the request.

Accordingly, to raise the resolution, super-resolution technologies for realizing miniaturization by reducing the value of process constant kl (kl=(resolution line width)×(numeric aperture of projection optical system)/(wavelength of exposure light)) have been recently proposed. As such super-resolution technologies, there are methods such as a method of optimizing a mask pattern by providing a supplementary pattern and a line width offset to the mask pattern according to the property of the exposure optical system, and a method called a deformed illumination method (also referred to as a grazing-incidence method). For the deformed illumination method, typically, orbicular zone illumination using a pupil filter, double-pole (also referred to as two-pole, two-point, or dipole) illumination and quadruple-pole (also referred to as four-pole, four-point, or quadruple) illumination, etc. are used.

Further, in the photolithography technology for transferring a pattern using a photomask, it is also known that there is a predetermined polarization state for preferably imaging a pattern on a wafer.

As described above, in photolithography with a half pitch of 60 nm or less, a photolithography technology using an ArF excimer laser as an exposing source for immersion exposure with a high-NA lens has a high degree of expectation. However, there is a problem that, even with the same process constant kl, the imaging performance is degraded and the contrast of an optical image within a photoresist (hereinafter, referred to as within resist) on a wafer is lowered due to a problem that the polarization dependency called "vector effect" by the high-NA optical system becomes significant, and a fine pattern of the photoresist on the wafer is not resolved (e.g., see Patent Document 1).

For instance, FIG. 13 shows a relationship between the optical image contrast of a conventional binary mask or halftone type phase shifting mask and a bias as a correction value of a space part of the mask pattern, which will be described later. As shown in FIG. 13, the optical image contrast takes a value of 0.580 at the maximum for the conventional halftone type phase shifting mask (indicated by a broken line HT), and a value of 0.612 at the maximum for the conventional binary mask (indicated by a solid line BIM).

To address the problem of the lower optical image contrast within resist due to higher NA, in the photomask, a method of changing a photomask material and a three-dimensional structure such as a cross-sectional shape of a photomask pattern (hereinafter, referred as mask pattern) or the like is considered.

However, in the photolithography with a half pitch of 60 nm or less, there are problems that various parameters relating to the optical image contrast within resist have complex relationships, demonstrations by experiments are difficult because of ultrafine pattern, and a parameter of the photomask having a great effect on the contrast improvement and a photomask structure based thereon are not easily found.

Patent Document 1: JP-A-2004-111678

DISCLOSURE OF THE INVENTION

Problem to be Solved by the Invention

The invention has been achieved in view of the problems. That is, in photolithography with a half pitch of 60 nm or less, to provide a photomask suitable for improving the imaging performance that the photomask has and forming a good micro image with improved optical image contrast on a wafer.

Means for Solving the Problem

The inventors considered that, in photolithography with a half pitch of 60 nm or less covered by the photomask of the invention, a high-contrast optical image can be obtained on a wafer by optimizing the balance of the intensity of diffracted light of the photomask that passes through the pupil of a projection optical system and reaches a wafer regarding illumination light from the respective apertures of a quadruple-pole illumination, for example, and found a condition under which the optical image contrast is high in a photomask having a mask pattern of a light shielding film or semi-transparent film on a transparent substrate within a range in which the photomask can be realized, by changing the film thickness, the refractive index, and the extinction factor of the light shielding film or semi-transparent film and the bias of the space part of the mask pattern, and completed the invention.

To attain the object, the photomask cited in claim 1 is a photomask used for photolithography using an ArF excimer laser as an exposing source for immersion exposure by quadrupole-polarized illumination with a high-NA lens, characterized in that the photomask comprises a mask pattern of a light shielding film or semi-transparent film on a transparent substrate, and further characterized in that, given that a thickness of the light shielding film or semi-transparent film is "t" nm, a refractive index is "n", an extinction factor is "k", and a bias of a space part of the mask pattern is "d" nm, when "t", "d", "n" and "k" are adjusted and the photomask is used for the photolithography, optical image contrast takes a value exceeding 0.580.

A photomask recited in claim 2 is the photomask according to claim 1, further characterized in that the "t", "d" "n" and "k" are within ranges of $0<t\leq20$, $-100\leq d<-50$, $0.5\leq n<0.9$, and $2.8<k\leq3.0$ respectively.

A photomask recited in claim 3 is the photomask according to claim 1, further characterized in that the "t", "d", "n" and "k" are within ranges of $20<t\leq40$, $-100\leq d<0$, $0.5\leq n<2.9$, and $1.6<k\leq3.0$ respectively.

A photomask recited in claim 4 is the photomask according to claim 1, further characterized in that the "t", "d", "n" and "k" are within ranges of $40<t\leq60$, $-100\leq d<0$, $0.5\leq n<2.9$, and $1.0<k\leq3.0$ respectively.

A photomask recited in claim 5 is the photomask according to claim 1, further characterized in that the "t", "d", "n" and "k" are within ranges of $60<t\leq80$, $-100\leq d<-50$, $0.5\leq n\leq2.9$, and $0.6<k\leq3.0$ respectively.

A photomask recited in claim 6 is the photomask according to claim 1, further characterized in that the "t", "d", "n" and "k" are within ranges of $80<t\leq160$, $-100\leq d<-50$, $0.5\leq n\leq2.9$, and $0.4<k\leq3.0$ respectively.

A photomask recited in claim 7 is the photomask according to claim 1, further characterized in that the "t", "d", "n" and "k" are within ranges of $160<t\leq200$, $-100\leq d<-50$, $0.5\leq n\leq2.9$, and $0.2<k\leq3.0$ respectively.

A photomask recited in claim 8 is the photomask according to claim 1, further characterized in that the "t", "d", "n" and "k" are within ranges of $60<t\leq120$, $-50\leq d<0$, $0.5\leq n\leq2.9$, and $0.4<k\leq3.0$ respectively.

A photomask recited in claim 9 is the photomask according to claim 1, further characterized in that the "t", "d", "n" and "k" are within ranges of $120<t\leq160$, $-50\leq d<50$, $0.5\leq n\leq2.9$, and $0.2<k\leq3.0$ respectively.

A photomask recited in claim 10 is the photomask according to claim 1, further characterized in that the "t", "d", "n" and "k" are within ranges of $160<t\leq200$, $-50\leq d<50$, $0.5\leq n\leq2.9$, and $0.0<k\leq3.0$ respectively.

A photomask recited in claim 11 is the photomask according to claim 1, further characterized in that the "t", "d", "n" and "k" are within ranges of $40<t\leq60$, $0\leq d<50$, $0.5\leq n<1.3$, and $2.2<k\leq3.0$ respectively.

A photomask recited in claim 12 is the photomask according to claim 1, further characterized in that the "t", "d", "n" and "k" are within ranges of $60<t\leq80$, $0\leq d<50$, $0.5\leq n<2.5$, and $0.4<k\leq3.0$ respectively.

A photomask recited in claim 13 is the photomask according to claim 1, further characterized in that the "t", "d", "n" and "k" are within ranges of $80<t\leq120$, $0\leq d<50$, $0.5\leq n\leq2.9$, and $0.4<k\leq3.0$ respectively.

A photomask recited in claim 14 is the photomask according to claim 1, further characterized in that the "t", "d", "n" and "k" are within ranges of $140<t\leq160$, $50\leq d<100$, $0.5\leq n<0.7$, and $2.2<k<2.8$ respectively.

A photomask recited in claim 15 is the photomask according to claim 1, further characterized in that the "t", "d", "n" and "k" are within ranges of $160<t\leq180$, $50\leq d<100$, $0.5\leq n<1.5$, and $1.2<k<2.8$ respectively.

A photomask recited in claim 16 is the photomask according to claim 1, further characterized in that the "t", "d", "n" and "k" are within ranges of $180<t\leq200$, $50\leq d<100$, $0.5\leq n<2.1$, and $0.0<k<2.8$ respectively.

A photomask recited in claim 17 is the photomask according to claim 1, characterized in that, when the photomask does not use a phase shifting effect, given that the thickness of the light shielding film or semi-transparent film is "t" nm, the refractive index is "n", the extinction factor is "k", and the bias of the space part of the mask pattern is "d" nm, when "t", "d", "n" and "k" are adjusted and the photomask is used for the photolithography, the optical image contrast takes a value exceeding 0.612.

A photomask recited in claim 18 is the photomask according to claim 17, further characterized in that the "t", "d", "n" and "k" are within ranges of $20<t\leq-40$, $-100\leq d<-50$, $0.5\leq n<1.9$, and $1.8<k\leq3.0$ respectively.

A photomask recited in claim 19 is the photomask according to claim 17, further characterized in that the "t", "d", "n" and "k" are within ranges of $40<t\leq60$, $-100\leq d<-50$, $0.5\leq n<2.3$, and $1.0<k\leq3.0$ respectively.

A photomask recited in claim 20 is the photomask according to claim 17, further characterized in that the "t", "d", "n" and "k" are within ranges of $60<t\leq80$, $-100\leq d<0$, $0.5\leq n<2.9$, and $0.6<k\leq3.0$ respectively.

A photomask recited in claim 21 is the photomask according to claim 17, further characterized in that the "t", "d", "n", and "k" are within ranges of $80<t\leq100$, $-100\leq d<0$, $0.5\leq n<2.9$, and $0.4<k\leq3.0$ respectively.

A photomask recited in claim 22 is the photomask according to claim 17, further characterized in that the "t", "d", "n" and "k" are within ranges of $100<t\leq120$, $-100\leq d<0$, $0.5\leq n<2.9$, and $0.4<k\leq3.0$ respectively.

A photomask recited in claim 23 is the photomask according to claim 17, further characterized in that the "t", "d", "n" and "k" are within ranges of $120<t\leq140$, $-100\leq d<50$, $0.5\leq n<2.9$, and $0.4<k\leq3.0$ respectively.

A photomask recited in claim 24 is the photomask according to claim 17, further characterized in that the "t", "d", "n" and "k" are within ranges of $140<t\leq180$, $-100\leq d<-50$, $0.5\leq n<2.9$, and $0.4<k\leq3.0$ respectively.

A photomask recited in claim 25 is the photomask according to claim 17, further characterized in that the "t", "d", "n" and "k" are within ranges of $180<t\leq200$, $-100\leq d<-50$, $0.5\leq n\leq2.9$, and $0.2<k\leq3.0$ respectively.

A photomask recited in claim 26 is the photomask according to claim 17, further characterized in that the "t", "d", "n" and "k" are within ranges of $20<t\leq40$, $-50\leq d<0$, $0.5\leq n<1.1$, and $1.8<k\leq3.0$ respectively.

A photomask recited in claim 27 is the photomask according to claim 17, further characterized in that the "t", "d", "n" and "k" are within ranges of $40<t\leq60$, $-50\leq d<0$, $0.5\leq n<2.3$, and $1.2<k\leq3.0$ respectively.

A photomask recited in claim 28 is the photomask according to claim 17, further characterized in that the "t", "d", "n" and "k" are within ranges of $140<t\leq200$, $-50\leq d<50$, $0.5\leq n\leq2.9$, and $0.2<k\leq3.0$ respectively.

A photomask recited in claim 29 is the photomask according to claim 17, further characterized in that the "t", "d", "n" and "k" are within ranges of $60<t\leq80$, $0\leq d<50$, $0.5\leq n<1.1$, and $2.2<k\leq3.0$ respectively.

A photomask recited in claim 30 is the photomask according to claim 17, further characterized in that the "t", "d", "n" and "k" are within ranges of $80<t\leq100$, $0\leq d<50$, $0.5\leq n<1.7$, and $0.8<k\leq3.0$ respectively.

A photomask recited in claim 31 is the photomask according to claim 17, further characterized in that the "t", "d", "n" and "k" are within ranges of $100<t\leq120$, $0\leq d<50$, $0.5\leq n<2.3$, and $0.6<k\leq3.0$ respectively.

A photomask recited in claim 32 is the photomask according to claim 17, further characterized in that the "t", "d", "n" and "k" are within ranges of $180 < t \leqq 200$, $50 \leqq d < 100$, $0.5 \leqq n < 1.3$, and $1.2 < k < 2.6$ respectively.

A photomask recited in claim 33 is the photomask according to any one of claims 1 to 32, further characterized in that the photomask has a mask pattern for semiconductor device with a half pitch of 60 nm or less.

A photomask recited in claim 34 is the photomask according to any one of claims 1 to 33, further characterized in that a numeric aperture of the high-NA lens is one or more.

EFFECT OF THE INVENTION

The photomask of the invention can improve the imaging performance that the photomask has and forming a good micro image with improved optical image contrast within resist on a wafer in photolithography with a half pitch of 60 nm or less using an ArF excimer laser as an exposing source for immersion exposure by quadrupole-polarized illumination with a high-NA lens.

BRIEF DESCRIPTION OF DRAWINGS

FIG. 3 is a diagram showing a relation to optical image contrast when the thickness of a light shielding film or semi-transparent film of a photomask in the embodiment of the invention is 20 nm, and the refractive index, the extinction factor, and the bias of the space part of the mask pattern are changed.

FIGS. 4A and 4B are diagrams showing a relation to optical image contrast when the thickness of a light shielding film or semi-transparent film of a photomask in the embodiment of the invention is 40 nm, and the refractive index, the extinction factor, and the bias of the space part of the mask pattern are changed.

FIGS. 5A to 5C are diagrams showing a relation to optical image contrast when the thickness of a light shielding film or semi-transparent film of a photomask in the embodiment of the invention is 60 nm, and the refractive index, the extinction factor, and the bias of the space part of the mask pattern are changed.

FIGS. 6A to 6C are diagrams showing a relation to optical image contrast when the thickness of a light shielding film or semi-transparent film of a photomask in the embodiment of the invention is 80 nm, and the refractive index, the extinction factor, and the bias of the space part of the mask pattern are changed.

FIGS. 7A to 7C are diagrams showing a relation to optical image contrast when the thickness of a light shielding film or semi-transparent film of a photomask in the embodiment of the invention is 100 nm, and the refractive index, the extinction factor, and the bias of the space part of the mask pattern are changed.

FIGS. 11A to 11D are diagrams showing a relation to optical image contrast when the thickness of a light shielding film or semi-transparent film of a photomask in the embodiment of the invention is 180 nm, and the refractive index, the extinction factor, and the bias of the space part of the mask pattern are changed.

DESCRIPTION OF REFERENCE NUMERALS

11: transparent substrate
12: mask pattern of light shielding film or semi-transparent film
21: translucent part
22: light shielding part

BEST MODE FOR CARRYING OUT THE INVENTION

Hereinafter, a best mode for carrying out the invention will be described with reference to the drawings.

Figure 1:
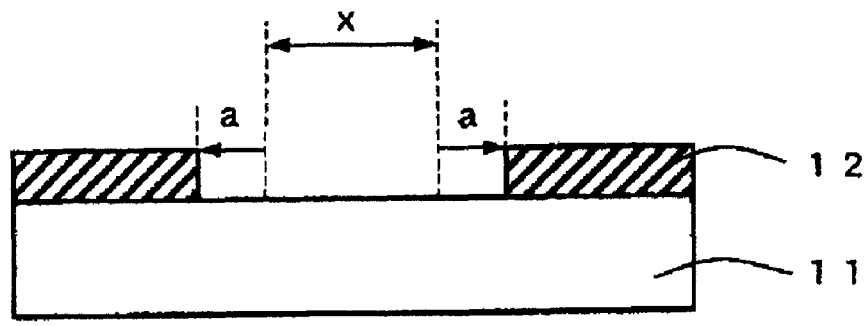
FIG. 1 is a sectional schematic diagram showing an example of a photomask of the invention.

FIG. 1 is a sectional schematic diagram showing an example of a photomask of the invention. As shown in FIG. 1, a photomask of the invention is a photomask having a mask pattern 12 of a light shielding film or semi-transparent film on a transparent substrate 11 and used for photolithography using an ArF excimer laser as an exposing source for immersion exposure by quadrupole-polarized illumination with a high-NA lens, and the photomask taking a value of the optical image contrast within resist exceeding at least 0.580.

In the invention, improvements in the imaging performance that the photomask has and the optical image contrast within resist are realized by optimizing the film thickness, the refractive index, and the extinction factor of the light shielding film or semi-transparent film of the photomask and the bias of the space part of the mask pattern. For the purpose, the best mode of the photomask is obtained by setting an illumination condition and an evaluation condition in exposure and using three-dimensional lithography simulation.

Now, a bias used in the invention is defined by taking FIG. 1 as an example. The bias "d" nm as a correction value of dimensions of the space part "x" of the mask pattern 12 of the light shielding film or semi-transparent film on the transparent substrate 11 is defined as below.

$$\text{Bias }(d) = 2 \times a$$

In FIG. 1, the mask is a tetraploid reticle and "x" takes a numeric value of four times the half pitch. In FIG. 1, when the bias "d" value is positive, "x" tends to be wider, and, when the "d" value is negative, "x" tends to be narrower.

When a mask pattern for semiconductor device with a half pitch around 65 nm as dimensions of the mask pattern of the photomask of the invention is used, exposure using a lens with small NA less than one as a projector lens can be performed, and thus, it is considered that the degree of influence by the photomask of the invention intended for exposure by a high-NA lens is small and the difference between the photomask according to the invention and the photomask according to the conventional technology is not significant. Therefore, the invention is preferably applied to a photomask having a mask pattern for semiconductor device with a half pitch of 60 nm or less including a half pitch of 45 nm that needs exposure by a high-NA lens.

(Lithography Condition)

As an illumination condition of a photomask, in the invention, in photolithography with a half pitch of 60 nm or less, an ArF excimer laser having an exposure wavelength of 193 nm is used, the numeric aperture (NA) of a projector lens is set to 1.3, and immersion exposure using pure water is employed. Note that the case of using a high-NA lens with NA=1.3 will be explained as an example of an embodiment, however, in the photomask of the invention, a high-NA lens with NA of one or more can obtain an effect of improvement in contrast as is the case of NA=1.3, and the effect of improvement in contrast can be obtained in immersion exposure using a highly-refractive liquid, for example.

Figure 2:
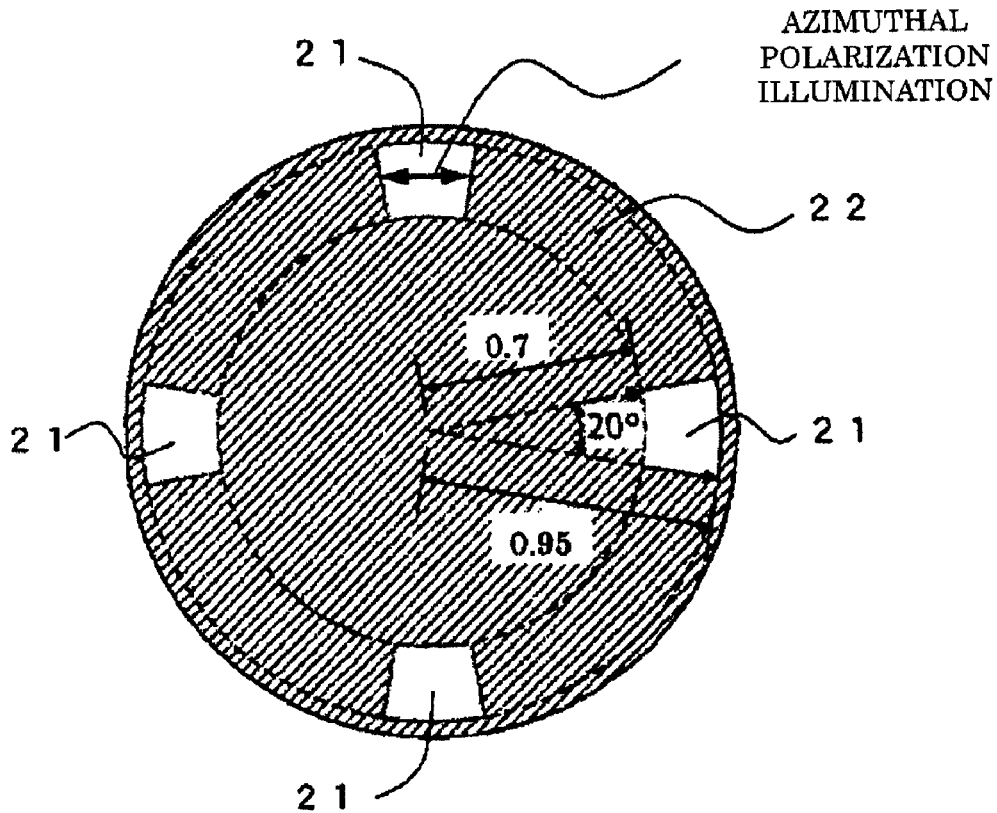
FIG. 2 is a top surface schematic diagram of a pupil filter of quadruple-pole (Azimuthal) polarization illumination used in the invention.

In the case of using the photomask of the invention, as the illumination system, quadruple-pole (Azimuthal) polarization illumination as shown in FIG. 2 is set. FIG. 2 shows a top surface schematic diagram of a pupil filter used for quadruple-pole illumination. As shown in FIG. 2, the quadruple-pole pupil filter includes four translucent parts 21 and the four translucent parts 21 have symmetric sector shapes at a predetermined equal distance from the center of the pupil filter on the diameter of the pupil filter, and the translucent parts 21 are provided at 0 degree and 90 degrees relative to the mask pattern so that longitudinal and lateral mask patterns can be transferred with high resolution and the part other than the four translucent parts 21 are light shielding parts 22 (shaded parts).

FIG. 2 shows the dimensions of the quadruple-pole pupil filter as an example and shows a pupil of the sector shape such that, assuming that the pupil diameter is one, the outer diameter of the aperture is 0.95, the inner diameter is 0.7, and the angle is 20°, however, intrinsically, the invention is not limited to those dimensions.

The quadruple-pole illumination as shown in FIG. 2 is used because the quadruple-pole illumination can resolve the longitudinal and lateral patterns at the same time and is applicable to general mask pattern transfer because of its higher universality than that of double-pole illumination. Further, as shown in FIG. 2, azimuthal polarization illumination in which an amplitude direction of an electric field at a certain point is a direction at 90° from a segment of line connecting the center of the pupil and the point is provided for improvement in resolution.

In FIG. 2, the four translucent parts 21 of the quadruple-pole pupil have sector shapes, however, the parts may have other shapes of, for example, circular shapes, rectangular shapes, or oval shapes.

(Evaluation Method)

As an evaluation method of a photomask, in the invention, for estimation of transfer characteristics of the mask pattern in the photolithography, EM-Suite (trade name: manufactured by Panoramic Technology Inc.) is used as simulation software. Further, for three-dimensional electromagnetic field simulation of the photomask, the Non-constant scattering coefficient model in FDTD method (also referred to as time-domain difference method or finite-difference time-domain method) according to TEMPESTpr2 (EM-Suite option) is used. The simulation grids for electromagnetic field analysis in a mask are provided at 2.5 nm in the thickness direction of the mask and 3.0 nm in the pattern repetition direction on the mask dimensions, Aerial in Resist model is used for resolution performance evaluation, and thereby, the optical image contrast within resist is obtained. Further, the refractive index of the resist is 1.72. The FDTD method is a method of differentiating Maxwell equations with respect to time and space and alternately calculating the difference equation with respect to the magnetic field and electric field until the electromagnetic field within the domain becomes stable, and the method enables high-precision reproduction of various kinds of phenomenon such as influence by a photomask structure.

In the invention, a new photomask structure by which a value exceeding the maximum value of the optical image contrast within resist when a conventional photomask is used is obtained using the simulation. Regarding the photomask structure, as factors that largely affect the contrast, the film thickness, the refractive index, and the extinction factor of the light shielding film or semi-transparent film and the bias of the space part are set for obtaining the range of values in which the optical image contrast exceeds 0.580.

First Embodiment

A photomask of the first embodiment of the invention is a photomask used for photolithography using an ArF excimer laser as an exposing source for immersion exposure by quadrupole-polarized illumination with a high-NA lens, and the photomask has a mask pattern of a light shielding film or semi-transparent film on a transparent substrate. The photomask has optical image contrast within resist exceeding 0.580, when the use or nonuse of the phase shifting effect is irrelevant in the photolithography.

FIGS. 3 to 12 show the relationships among the thickness "t" nm, the refractive index "n" and extinction factor "k" of the light shielding film or semi-transparent film of the photomask, the bias "d" nm of the space part of the mask pattern in the first embodiment of the invention, and the optical image contrast in lithography using the photomask.

In FIGS. 3 to 12, the horizontal axis indicates the refractive index of the light shielding film or semi-transparent film, the vertical axis indicates the extinction factor, and level lines in the respective drawings show optical image contrast (hereinafter, also referred to as "c") within resist in lithography using the photomask. In FIGS. 3 to 12, the contrast "c" is classified in a range of 0.580 or less, a range exceeding 0.580 to 0.612 or less, and a range exceeding 0.612. Further, in FIGS. 3 to 12, (A), (B), (C) and (D) are the bias "d" of the space part of the mask pattern in the respective film thicknesses, and (A) shows the case where d=−100 nm, (B) shows the case where d=−50 nm, (C) shows the case where d=0 nm, (D) shows the case where d=50 nm as examples.

As below, conditions of the photomask, under which the optical image contrast within resist exceeds 0.580 when the thickness "t" of the light shielding film or semi-transparent film of the photomask is increased from 20 nm to 200 nm by 20 nm and the bias is changed, will be explained.

EXAMPLE 1

FIG. 3A shows an example when the thickness of the light shielding film or semi-transparent film of the photomask is 20 nm and the bias of the space part of the mask pattern is −100 nm, and shows that an optical image with contrast within a range of 0.594 to 0.606 can be obtained using the photomask having the refractive index "n" of the light shielding film or semi-transparent film within a range of $0.5 \leq n < 0.9$ and the extinction factor "k" within a range of $2.8 < k \leq 3.0$.

In the example, as the conditions of the photomask having contrast exceeding 0.580, the ranges of $0 < t \leq 20$, $-100 \leq d < -50$, $0.5 \leq n < 0.9$, and $2.8 < k \leq 3.0$ are obtained.

EXAMPLE 2

FIGS. 4A and 4B show examples when the thickness of the light shielding film or semi-transparent film of the photomask is 40 nm and the bias of the space part of the each mask pattern is −100 nm and −50 nm. From FIGS. 4A, 4B and 3A, it was shown that an optical image with contrast within a range of 0.581 to 0.860 can be obtained using the photomask having the refractive index "n" of the light shielding film or semi-transparent film within a range of $0.5 \leq n < 2.9$ and the extinction factor "k" within a range of $1.6 < k \leq 3.0$.

In the example, as the conditions of the photomask having contrast exceeding 0.580, the ranges of $20 < t \leq 40$, $-100 \leq d < 0$, $0.5 \leq n < 2.9$, and $1.6 < k \leq 3.0$ are obtained.

EXAMPLE 3

FIGS. 5A, 5B and 5C show examples when the thickness of the light shielding film or semi-transparent film of the photomask is 60 nm and the bias of the space part of the each mask pattern is −100 nm, −50 nm and 0 (zero). From FIGS. 5A, 5B and 5C, and FIGS. 4A and 4B, it was shown that an optical image with contrast within a range of 0.581 to 0.882 can be obtained using the photomask having the refractive index "n" of the light shielding film or semi-transparent film within a range of $0.5 \leq n \leq 2.9$ and the extinction factor "k" within a range of $1.0 < k \leq 3.0$.

In the example, as the conditions of the photomask having contrast exceeding 0.580, the ranges of $40 < t \leq 60$, $-100 \leq d < 0$, $0.5 \leq n \leq 2.9$, and $1.0 < k \leq 3.0$ are obtained.

EXAMPLE 4

FIGS. 6A and 6B show examples when the thickness of the light shielding film or semi-transparent film of the photomask is 80 nm and the bias of the space part of each mask pattern is −100 nm and −50 nm. From FIGS. 6A and 6B, and FIGS. 5A and 5B, it was shown that an optical image with contrast within a range of 0.581 to 0.831 can be obtained using the photomask having the refractive index "n" of the light shielding film or semi-transparent film within a range of $0.5 \leq n \leq 2.9$ and the extinction factor "k" within a range of $0.6 < k \leq 3.0$.

In the example, as the conditions of the photomask having contrast exceeding 0.580, the ranges of $60 < t \leq 80$, $-100 \leq d < -50$, $0.5 \leq n \leq 2.9$, and $0.6 < k \leq 3.0$ are obtained.

EXAMPLE 5

FIGS. 7A, 8A, 9A and 10A, and FIGS. 7B, 8B, 9B and 10B show examples when the respective thickness of the light shielding film or semi-transparent film of the photomask is 100 nm, 120 nm, 140 nm and 160 nm and the bias of the space part of the each mask pattern is −100 nm and −50 nm. From FIGS. 7A, 8A, 9A, 10A, 7B, 8B, 9B and 10B, and FIGS. 6A and 6B, it was shown that an optical image with contrast within a range of 0.581 to 0.975 can be obtained using the photomask having the refractive index "n" of the light shielding film or semi-transparent film within a range of $0.5 \leq n \leq 2.9$ and the extinction factor "k" within a range of $0.4 < k \leq 3.0$.

In the example, as the conditions of the photomask having contrast exceeding 0.580, the ranges of $80 < t \leq 160$, $-100 \leq d < -50$, $0.5 \leq n \leq -2.9$, and $0.4 < k \leq 3.0$ are obtained.

EXAMPLE 6

FIGS. 11A, 12A and FIGS. 11B, 12B show examples when the respective thickness of the light shielding film or semi-transparent film of the photomask is 180 nm and 200 nm and the bias of the space part of the each mask pattern is −100 nm and −50 nm. From FIGS. 11A, 11B, 12A and 12B, and FIGS. 10A and 10B, it was shown that an optical image with contrast within a range of 0.581 to 0.987 can be obtained using the photomask having the refractive index "n" of the light shielding film or semi-transparent film within a range of $0.5 \leq n \leq 2.9$ and the extinction factor "k" within a range of $0.2 < k \leq 3.0$.

In the example, as the conditions of the photomask having contrast exceeding 0.580, the ranges of $160 < t \leq 200$, $-100 \leq d < -50$, $0.5 \leq n \leq 2.9$, and $0.2 < k \leq 3.0$ are obtained.

EXAMPLE 7

Figures 8A, 8B, 8C:
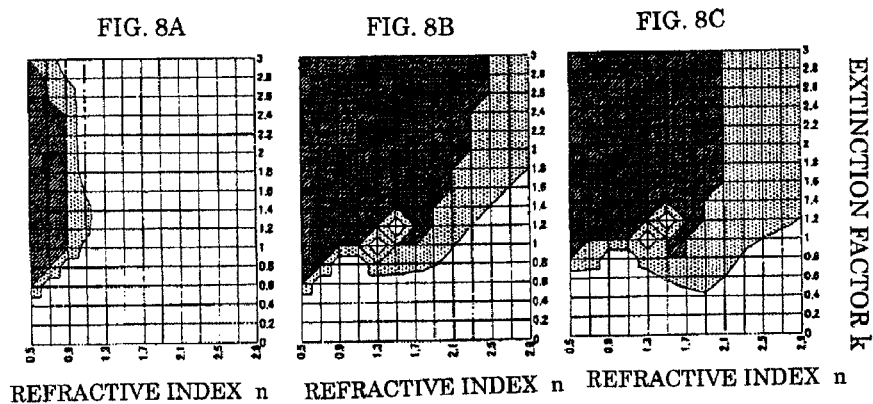
FIGS. 8A to 8C are diagrams showing a relation to optical image contrast when the thickness of a light shielding film or semi-transparent film of a photomask in the embodiment of the invention is 120 nm, and the refractive index, the extinction factor, and the bias of the space part of the mask pattern are changed.

FIGS. 6C, 7C and 8C show examples when the thickness of the respective light shielding film or semi-transparent film of the photomask is 80 nm, 100 nm and 120 nm, and the bias of the space part of the mask pattern is 0 (zero). From FIGS. 6B, 7B, 8B and FIGS. 5B, 5C, 6C, 7C and 8C, it was shown that an optical image with contrast within a range of 0.581 to 0.873 can be obtained using the photomask having the refractive index "n" of the light shielding film or semi-transparent film within a range of $0.5 \leq n \leq 2.9$ and the extinction factor "k" within a range of $0.4 < k \leq 3.0$.

In the example, as the conditions of the photomask having contrast exceeding 0.580, the ranges of $60 < t \leq 120$, $-50 \leq d < 0$, $0.5 \leq n \leq 2.9$, and $0.4 < k \leq 3.0$ are obtained.

EXAMPLE 8

Figures 9A, 9B, 9C:
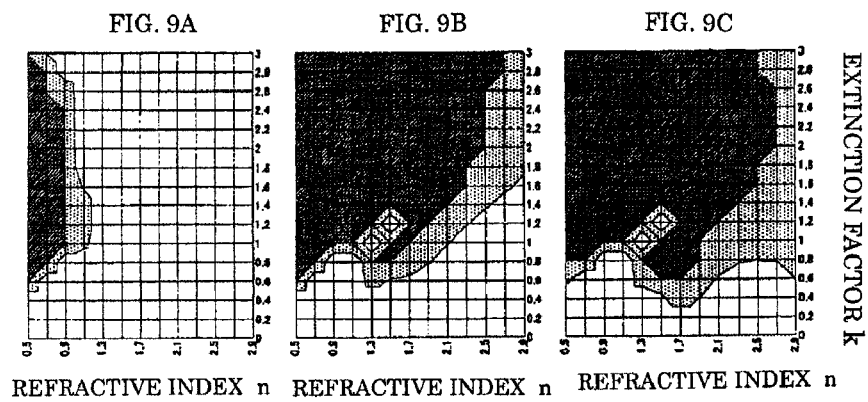
FIGS. 9A to 9C are diagrams showing a relation to optical image contrast when the thickness of a light shielding film or semi-transparent film of a photomask in the embodiment of the invention is 140 nm, and the refractive index, the extinction factor, and the bias of the space part of the mask pattern are changed.
Figure 10A:
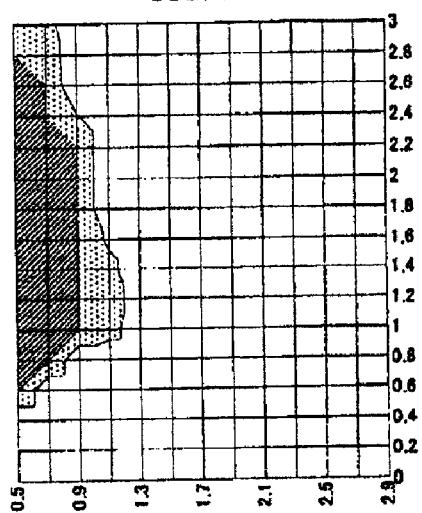
FIGS. 10A to 10D are diagrams showing a relation to optical image contrast when the thickness of a light shielding film or semi-transparent film of a photomask in the embodiment of the invention is 160 nm, and the refractive index, the extinction factor, and the bias of the space part of the mask pattern are changed.
Figure 10B:
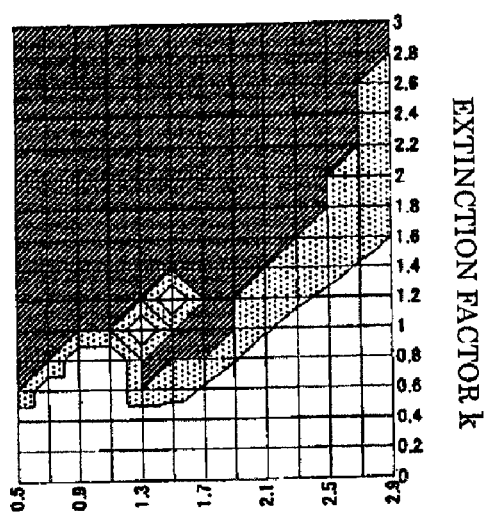
Figure 10C:
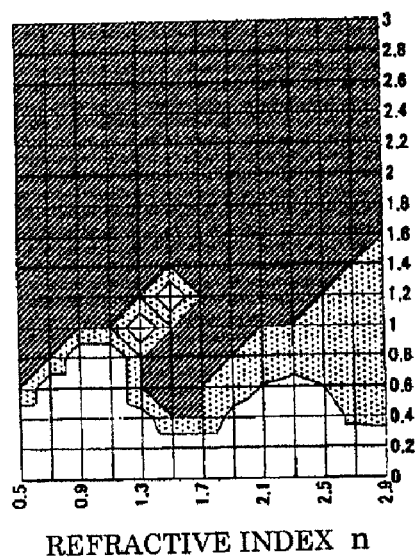
Figure 10D:
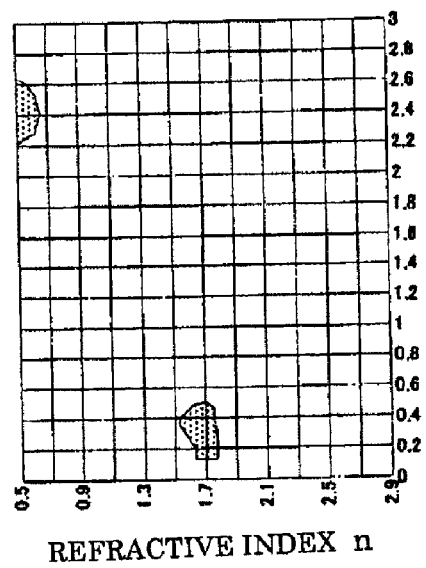

FIGS. 9C, 10C and 10D show: examples when the thickness of the respective light shielding film or semi-transparent film of the photomask is 140 nm and 160 nm, and the bias of the space part of the mask pattern is 0 (zero); and an example when the thickness of the light shielding film or semi-transparent film of the photomask is 160 nm, and the bias of the space part of the mask pattern is 50. From FIGS. 8B, 8C, 9B, 9C, 10B, 10C and 10D, it was shown that an optical image with contrast within a range of 0.581 to 0.941 can be obtained using the photomask having the refractive index "n" of the light shielding film or semi-transparent film within a range of $0.5 \leq n \leq 2.9$ and the extinction factor "k" within a range of $0.2 < k \leq 3.0$.

In the example, as the conditions of the photomask having contrast exceeding 0.580, the ranges of $120 < t \leq 160$, $-50 \leq d < 50$, $0.5 \leq n \leq 2.9$, and $0.2 < k \leq 3.0$ are obtained.

EXAMPLE 9

FIGS. 11C, 12C and FIGS. 11D, 12D show examples when the thickness of the respective light shielding film or semi-transparent film of the photomask is 180 nm and 200 nm, and the bias of the each space part of the mask pattern is 0 (zero) and 50 nm. From FIGS. 10B, 10C, 11B, 11C, 12B and 12C, and FIGS. 10D, 11D, 12D, it was shown that an optical image with contrast within a range of 0.581 to 0.972 can be obtained using the photomask having the refractive index "n" of the light shielding film or semi-transparent film within a range of $0.5 \leq n \leq 2.9$ and the extinction factor "k" within a range of $0.2 < k \leq 3.0$.

In the example, as the conditions of the photomask having contrast exceeding 0.580, the ranges of $160 < t \leq 200$, $-50 \leq d < 50$, $0.5 \leq n \leq 2.9$, and $0.0 < k \leq 3.0$ are obtained.

EXAMPLE 10

From FIG. 5C, it was shown that an optical image with contrast within a range of 0.581 to 0.607 can be obtained using the photomask having the refractive index "n" of the light shielding film or semi-transparent film within a range of $0.5 \leq n < 1.3$ and the extinction factor "k" within a range of $2.2 < k \leq 3.0$.

In the example, as the conditions of the photomask having contrast exceeding 0.580, the ranges of $40 < t \leq 60$, $0 \leq d < 50$, $0.5 \leq n < 1.3$, and $2.2 < k \leq 3.0$ are obtained.

EXAMPLE 11

From FIGS. 6C and 5C, it was shown that an optical image with contrast within a range of 0.581 to 0.635 can be obtained using the photomask having the refractive index "n" of the light shielding film or semi-transparent film within a range of $0.5 \leq n < 2.5$ and the extinction factor "k" within a range of $0.4 < k \leq 3.0$.

In the example, as the conditions of the photomask having contrast exceeding 0.580, the ranges of $60 < t \leq 80$, $0 \leq d < 50$, $0.5 \leq n < 2.5$, and $0.4 < k \leq 3.0$ are obtained.

EXAMPLE 12

From FIGS. 7C, 8C and 6C, it was shown that an optical image with contrast within a range of 0.581 to 0.716 can be obtained using the photomask having the refractive index "n" of the light shielding film or semi-transparent film within a range of $0.5 \leq n \leq 2.9$ and the extinction factor "k" within a range of $0.4 < k \leq 3.0$.

In the example, as the conditions of the photomask having contrast exceeding 0.580, the ranges of $80 < t \leq 120$, $0 \leq d < 50$, $0.5 \leq n \leq 2.9$, and $0.4 < k \leq 3.0$ are obtained.

EXAMPLE 13

From FIG. 10D, it was shown that an optical image with contrast within a range of 0.583 to 0.596 can be obtained using the photomask having the refractive index "n" of the light shielding film or semi-transparent film within a range of $0.5 \leq n < 0.7$ and the extinction factor "k" within a range of $2.2 < k < 2.8$.

In the example, as the conditions of the photomask having contrast exceeding 0.580, the ranges of $140 < t \leq 160$, $50 \leq d < 100$, $0.5 \leq n < 0.7$, and $2.2 < k < 2.8$ are obtained.

EXAMPLE 14

From FIGS. 11D and 10D, it was shown that an optical image with contrast within a range of 0.581 to 0.601 can be obtained using the photomask having the refractive index "n" of the light shielding film or semi-transparent film within a range of $0.5 \leq n < 1.5$ and the extinction factor "k" within a range of $1.2 < k < 2.8$.

In the example, as the conditions of the photomask having contrast exceeding 0.580, the ranges of $160 < t \leq 180$, $50 \leq d < 100$, $0.5 \leq n < 1.5$, and $1.2 < k < 2.8$ are obtained.

EXAMPLE 15

Figure 12A:
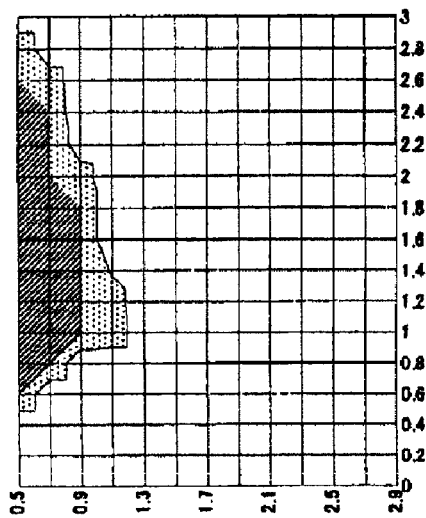
FIGS. 12A to 12D are diagrams showing a relation to optical image contrast when the thickness of a light shielding film or semi-transparent film of a photomask in the embodiment of the invention is 200 nm, and the refractive index, the extinction factor, and the bias of the space part of the mask pattern are changed.
Figure 12B:
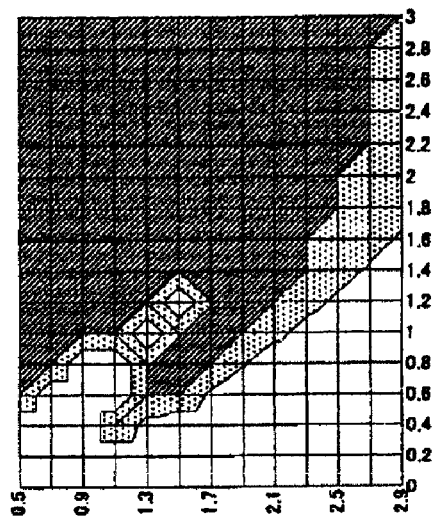
Figure 12C:
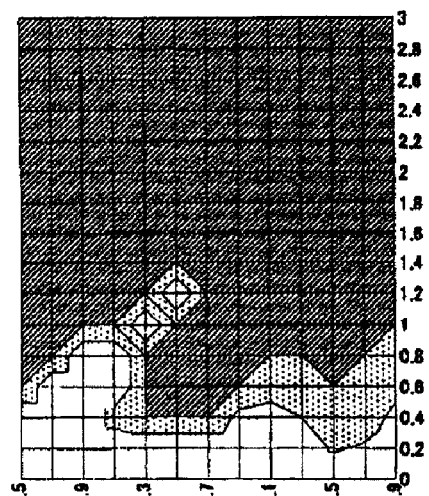
Figure 12D:
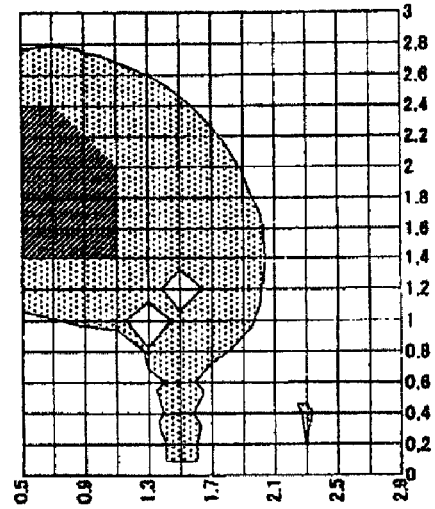
Figure 13:
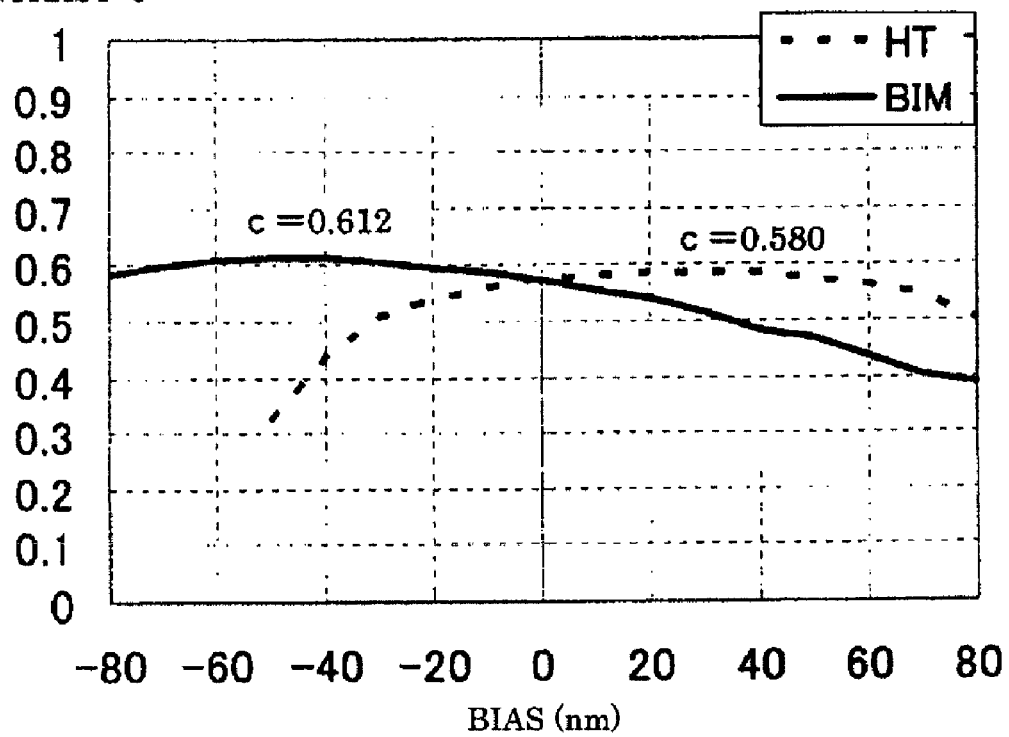
FIG. 13 is a diagram showing a relationship between the bias of conventional light shielding film of binary mask and semi-transparent film of halftone mask, and optical image contrast within resist.

From FIGS. 12D and 11D, it was shown that an optical image with contrast within a range of 0.581 to 0.643 can be obtained using the photomask having the refractive index "n" of the light shielding film or semi-transparent film within a range of $0.5 \leq n < 2.1$ and the extinction factor "k" within a range of $0.0 < k < 2.8$.

In the example, as the conditions of the photomask having contrast exceeding 0.580, the ranges of $180 < t \leq 200$, $50 \leq d < 100$, $0.5 \leq n < 2.1$, and $0.0 < k < 2.8$ are obtained.

Second Embodiment

The photomask of the second embodiment of the invention is a photomask used for photolithography using an ArF excimer laser as an exposing source for immersion exposure by quadrupole-polarized illumination with a high-NA lens, and the photomask has a mask pattern of a light shielding film or semi-transparent film on a transparent substrate. When the phase shifting effect is not used in the photolithography, the photomask has optical image contrast within resist exceeding 0.612.

Similar to the first embodiment, FIGS. 3 to 12 show the relationships among the thickness "t" nm, the refractive index "n" and extinction factor "k" of the light shielding film or semi-transparent film of the photomask, the bias "d" nm of the space part of the mask pattern in the second embodiment of the invention, and the optical image contrast in lithography using the photomask.

In FIGS. 3 to 12, the horizontal axis indicates the refractive index of the light shielding film or semi-transparent film, the vertical axis indicates the extinction factor, and level lines in the respective drawings show optical image contrast within resist in lithography using the photomask. In FIGS. 3 to 12, the contrast "c" is classified in a range of 0.580 or less, a range exceeding 0.580 to 0.612 or less, and a range exceeding 0.612. Further, in FIGS. 3 to 12, (A), (B), (C) and (D) are the bias "d" of the space part of the mask pattern in the respective film thicknesses, and (A) shows the case where d=−100 nm, (B) shows the case where d=−50 nm, (C) shows the case where d=0 nm, (D) shows the case where d=50 nm as examples.

As below, conditions of the photomask, under which the optical image contrast within resist exceeds 0.612 when the thickness "t" of the light shielding film or semi-transparent film of the photomask is increased from 20 nm to 200 nm by 20 nm and the bias is changed, will be explained. As the same drawings to the first embodiment are used, the same explanations are omitted.

EXAMPLE 16

FIGS. 4A, 4B and 3A show that an optical image with contrast within a range of 0.614 to 0.860 can be obtained.

In the example, as the conditions of the photomask having contrast exceeding 0.612, the ranges of $20 < t \leq 40$, $-100 \leq d < -50$, $0.5 \leq n < 1.9$, and $1.8 < k \leq 3.0$ are obtained.

EXAMPLE 17

FIG. 5A, and FIGS. 4A, 4B and 5B show that an optical image with contrast within a range of 0.613 to 0.882 can be obtained.

In the example, as the conditions of the photomask having contrast exceeding 0.612, the ranges of 40<t≦60, −100≦d<−50, 0.5≦n<2.3, and 1.0<k≦3.0 are obtained.

EXAMPLE 18

FIGS. 6A and 6B, and FIGS. 5A, 5B, 5C and 6C show that an optical image with contrast within a range of 0.613 to 0.831 can be obtained.

In the example, as the conditions of the photomask having contrast exceeding 0.612, the ranges of 60<t≦80, −100≦d<0, 0.5≦n<2.9, and 0.6<k≦3.0 are obtained.

EXAMPLE 19

FIGS. 7A and 7B, and FIGS. 6A, 6B, 6C and 7C show that an optical image with contrast within a range of 0.613 to 0.881 can be obtained.

In the example, as the conditions of the photomask having contrast exceeding 0.612, the ranges of 80<t≦−100, −100≦d<0, 0.5≦n<2.9, and 0.4<k≦3.0 are obtained.

EXAMPLE 20

FIGS. 8A and 8B, and FIGS. 7A, 7B, 7C and 8C show that an optical image with contrast within a range of 0.613 to 0.937 can be obtained.

In the example, as the conditions of the photomask having contrast exceeding 0.612, the ranges of 100<t≦120, −100≦d<0, 0.5≦n<2.9, and 0.4<k≦3.0 are obtained.

EXAMPLE 21

FIG. 9A, and FIGS. 8A, 8B and 9B show that an optical image with contrast within a range of 0.613 to 0.961 can be obtained.

In the example, as the conditions of the photomask having contrast exceeding 0.612, the ranges of 120<t≦140, −100≦d<50, 0.5≦n<2.9, and 0.4<k≦3.0 are obtained.

EXAMPLE 22

FIGS. 10A and 11A, and FIGS. 9A, 9B, 10B and 11B show that an optical image with contrast within a range of 0.613 to 0.983 can be obtained.

In the example, as the conditions of the photomask having contrast exceeding 0.612, the ranges of 140<t≦180, −100≦d<−50, 0.5≦n<2.9, and 0.4<k≦3.0 are obtained.

EXAMPLE 23

FIG. 12A, and FIGS. 11A, 11B and 12B show that an optical image with contrast within a range of 0.614 to 0.987 can be obtained.

In the example, as the conditions of the photomask having contrast exceeding 0.612, the ranges of 180<t≦200, −100≦d<−50, 0.5≦n≦2.9, and 0.2<k≦3.0 are obtained.

EXAMPLE 24

FIG. 4B shows that an optical image with contrast within a range of 0.614 to 0.685 can be obtained.

In the example, as the conditions of the photomask having contrast exceeding 0.612, the ranges of 20<t≦40, −50≦d<0, 0.5≦n<1.1, and 1.8<k≦3.0 are obtained.

EXAMPLE 25

FIG. 5B, and FIGS. 4B and 5C show that an optical image with contrast within a range of 0.613 to 0.769 can be obtained.

In the example, as the conditions of the photomask having contrast exceeding 0.612, the ranges of 40<t≦60, −50≦d<0, 0.5≦n<2.3, and 1.2<k≦3.0 are obtained.

EXAMPLE 26

FIGS. 10B, 10C, 11B, 11C, 12B and 12C, and FIGS. 9B, 9C, 10D, 11D and 12D show that an optical image with contrast within a range of 0.613 to 0.972 can be obtained.

In the example, as the conditions of the photomask having contrast exceeding 0.612, the ranges of 140<t≦200, −50≦d<50, 0.5≦n<2.9, and 0.2<k≦3.0 are obtained.

EXAMPLE 27

FIGS. 6C and 5C show that an optical image with contrast within a range of 0.613 to 0.635 can be obtained.

In the example, as the conditions of the photomask having contrast exceeding 0.612, the ranges of 60<t≦80, 0≦d<50, 0.5≦n<1.1, and 2.2<k≦3.0 are obtained.

EXAMPLE 28

FIGS. 7C and 6C show that an optical image with contrast within a range of 0.613 to 0.655 can be obtained.

In the example, as the conditions of the photomask having contrast exceeding 0.612, the ranges of 80<t≦100, 0≦d<50, 0.5≦n<1.7, and 0.8<k≦3.0 are obtained.

EXAMPLE 29

FIGS. 8C and 7C show that an optical image with contrast within a range of 0.613 to 0.716 can be obtained.

In the example, as the conditions of the photomask having contrast exceeding 0.612, the ranges of 100<t≦120, 0≦d<50, 0.5≦n<2.3, and 0.6<k≦3.0 are obtained.

EXAMPLE 30

FIGS. 12D and 11D show that an optical image with contrast within a range of 0.613 to 0.643 can be obtained.

In the example, as the conditions of the photomask having contrast exceeding 0.612, the ranges of 180<t≦200, 50≦d<100, 0.5≦n<1.3, and 1.2<k<2.6 are obtained.

As shown in the example 1 to example 30, the optical image contrast of the resist is improved and a good micro image can be formed on a wafer using the photomask of the invention.

The invention claimed is:

1. A photomask used for photolithography using an ArF excimer laser as an exposing source for immersion exposure by quadrupole-polarized illumination with a high-NA lens, wherein the photomask comprises a mask pattern of a light shielding film or semi-transparent film on a transparent substrate, wherein, given that a thickness of the light shielding film or semi-transparent film is "t" nm, a refractive index is "n", an extinction factor is "k", and a bias of a space part of the mask pattern is "d" nm, when "t", "d", "n" and "k" are adjusted and the photomask is used for the photolithography, optical image contrast has a value exceeding 0.580, and further wherein the "t", "d", "n" and "k" are one set selected from the following ranges: 0<t≦20, −100≦d <−50, 0.5≦n<0.9, and 2.8<k≦3.0; 20<t ≦40, −100≦d<0, 0.5≦n <2.9, and 1.6<k≦3.0; 40<t≦60, −100≦d<0, 0.5≦n≦2.9, and 1.0<k≦3.0; 60<t≦80, −100≦d <−50, 0.5≦n≦2.9, 0.6<k≦3.0; 80<t≦160, −100≦d<−50, 0.5≦n≦2.9, and 0.4<k ≦3.0; 160<t≦200, −100≦d<−50, 0.5≦n≦2.9, and $0.2<k \leq 3.0$; $60<t\leq120$, $-50\leq d<0$, $0.5\leq n\leq2.9$, and $0.4<k\leq3.0$; $120<t\leq160$, $-50\leq d<50$, $0.5\leq n\leq2.9$, and $0.2<k\leq3.0$; $160<t\leq200$, $-50\leq d<50$, $0.5\leq n\leq2.9$, and $0.0<k\leq3.0$; $40<t\leq60$, $0\leq d<50$, $0.5\leq n<1.3$, and $2.2<k\leq3.0$; $60<t\leq80$, $0\leq d<50$, $0.5\leq n<2.5$, and $0.4<k\leq3.0$; $80<t\leq120$, $0\leq d<50$, $0.5\leq n\leq2.9$, and $0.4<k\leq3.0$; $140<t\leq160$, $50\leq d<100$, $0.5\leq n<0.7$, and $2.2<k<2.8$; $160<t\leq180$, $50\leq d<100$, $0.5\leq n<1.5$, and $1.2<k<2.8$; and $180<t\leq200$, $50\leq d<100$, $0.5\leq n<2.1$, and $0.0<k<2.8$.

2. The photomask according to claim 1, wherein, when the photomask does not use a phase shifting effect, given that the thickness of the light shielding film or semi-transparent film is "t" nm, the refractive index is "n", the extinction factor is "k", and the bias of the space part of the mask pattern is "d" nm, when "t", "d", "n" and "k" are adjusted and the photomask is used for the photolithography, the optical image contrast has a value exceeding 0.612, and wherein the "t", "d", "n" and "k" are one set selected from the following ranges: $20<t\leq40$, $-100\leq d<-50$, $0.5\leq n<1.9$, and $1.8<k\leq3.0$; $40<t60$, $-100\leq d<-50$, $0.5\leq n<2.3$, and $1.0<k3.0$; $60<t\leq80$, $-100\leq d<0$, $0.5\leq n<2.9$, and $0.6<k\leq3.0$; $80<t\leq100$, $-100\leq d<0$, $0.5\leq n<2.9$, and $0.4<k\leq3.0$; $100<t\leq120$, $-100\leq d<0$, $0.5\leq n<2.7$, and $0.4<k\leq3.0$; $120<t\leq140$, $-100\leq d<50$, $0.5\leq n<2.9$, and $0.4<k\leq3.0$; $140<t\leq180$, $-100\leq d<-50$, $0.5\leq n\leq2.9$, and $0.4<k\leq3.0$; $180<t\leq200$, $-100\leq d<-50$, $0.5\leq n\leq2.9$, and $0.2<k\leq3.0$; $20<t\leq40$, $-50\leq d<0$, $0.5\leq n<1.1$, and $1.8<k\leq3.0$; $40<t\leq60$, $-50\leq d<0$, $0.5\leq n<2.3$, and $1.2<k\leq3.0$; $140<t\leq200$; $-50\leq d<50$, $0.5\leq n\leq2.9$, and $0.2<k\leq3.0$: $60<t\leq80$, $0\leq d<50$, $0.5\leq n<1.1$, and $2.2<k\leq3.0$; $80<t\leq100$, $0\leq d<50$, $0.5\leq n<1.7$, and $0.8<k\leq3.0$; $100<t\leq120$, $0\leq d<50$, $0.5\leq n<2.3$, and $0.6<k\leq3.0$; and $180<t\leq200$, $50\leq d<100$, $0.5\leq n<1.3$, and $1.2<k<2.6$.

3. The photomask according to claim 1, wherein the photomask has a mask pattern for semiconductor device with a half pitch of 60 nm or less.

4. The photomask according to claim 1, wherein a numeric aperture of the high-NA lens is one or more.

5. The photomask according to claim 2, wherein the photomask has a mask pattern for semiconductor device with a half pitch of 60 nm or less.

6. The photomask according to claim 2, wherein a numeric aperture of the high-NA lens is one or more.

\* \* \* \* \*